United States Patent [19]

Chiang et al.

[11] Patent Number: 5,316,971
[45] Date of Patent: May 31, 1994

[54] METHODS FOR PROGRAMMING ANTIFUSES HAVING AT LEAST ONE METAL ELECTRODE

[75] Inventors: Steve S. Chiang, Saratoga; Wenn-Jei Chen, Sunnyvale; Esam Elashmawi, San Jose, all of Calif.

[73] Assignee: Actel Corporation, Sunnyvale, Calif.

[21] Appl. No.: 947,103

[22] Filed: Sep. 18, 1992

[51] Int. Cl.⁵ .................. H01L 21/14; H01L 21/306; H01L 21/326; H01L 21/465
[52] U.S. Cl. ................................. 437/170; 437/172; 437/922
[58] Field of Search ............... 437/922, 52, 8, 195, 437/170; 365/96; 307/202.1; 257/530

[56] References Cited

U.S. PATENT DOCUMENTS

| | | | |
|---|---|---|---|
| 5,008,855 | 4/1991 | Eltoukhy et al. | 365/172 |
| 5,095,362 | 3/1992 | Roesner | 257/330 |
| 5,126,282 | 6/1992 | Chiang et al. | 437/172 |

Primary Examiner—Olik Chaudhuri
Assistant Examiner—H. Jey Tsai
Attorney, Agent, or Firm—D'Alessandro, Frazzini & Ritchie

[57] ABSTRACT

A method for programming antifuses having at least one metal electrode includes the steps of providing an antifuse programming voltage source, capable of supplying alternating positive and negative programming voltage pulses; providing a programming path from the antifuse programming voltage source to the antifuse; and providing a selected number of alternating positive and negative programming voltage pulses to the antifuse through the programming path.

8 Claims, 4 Drawing Sheets

METHODS FOR PROGRAMMING ANTIFUSES HAVING AT LEAST ONE METAL ELECTRODE

BACKGROUND OF THE INVENTION

1. Field Of The Invention

The present patent invention relates generally to semiconductor technology. More specifically, the present invention relates to one-time user-programmable antifuses which have at least one metal electrode, and to methods for programming such antifuses which reduce the read-disturb phenomenon observed is such antifuses.

2. The Prior Art

User programmable antifuse devices have been used in programmable logic applications, for example field programmable gate arrays. An antifuse typically comprises a layer of antifuse material sandwiched in between two conductive electrodes. The antifuse device is initially an essentially open circuited device in its unprogrammed state and can be irreversibly converted into an essentially short circuited device by the application of a programming voltage across the two electrodes to disrupt the antifuse material and create a low resistance current path between the two electrodes.

One type of antifuses utilizes an N+doped substrate region as a lower electrode and an N+arsenic-doped polysilicon line as a second electrode. An oxide-nitride-oxide (ONO) layer sandwich is employed as the antifuse material. Such a device is described in U.S. Pat. No. 4,823,181 and U.S. Pat. No. 4,881,114. Antifuse programming methods for antifuses including at least one arsenic-doped electrode range from applying continuous DC programming potentials to applying pulsed DC programming potentials followed by AC "soaking" as described in U.S. Pat. No. 5,126,282. The method described and claimed in U.S. Pat. No. 5,126,282 employs the step of initially applying a DC programming potential difference such that the positive potential thereof is applied to the one of the antifuse electrodes containing the highest concentration of arsenic. U.S. Pat. No. 5,126,282 also teaches "soaking" already-programmed arsenic-electrode-containing antifuses with AC "soak" pulses to lower final antifuse resistance. The above-identified patent teaches the criticality of the polarity of the starting and finishing pulses in relation to the arsenic-containing electrode.

Another type of antifuse comprises an antifuse material disposed between a layer of polysilicon and a metal layer or between a pair of metal electrodes which may comprise different metal layers in a multilayer metal semiconductor fabrication process. The latter type of antifuse is referred to as a metal-to-metal antifuse. Such antifuses usually employ a layer of amorphous silicon as the antifuse material, although they may also employ other antifuse materials, such as oxide, nitride, oxide-nitride, nitride-oxide, oxide-nitride-oxide, nitride,-oxide-nitride layers, or combinations of amorphous silicon with thin dielectric materials mentioned above. The metal-to-metal antifuse offers the advantage of low antifuse resistance (on resistance) after programming. The low on resistance of the amorphous silicon metal-to-metal antifuse results from the substitution of metal as the conductive filament element in place of the polysilicon conductive filament of the first type of antifuse.

When a plurality of voltage pulses are applied to an antifuse to program it, the electric field is chosen to be above the breakdown voltage of the antifuse. The antifuse can change its state from a non-conducting (off) state, where its resistance is in the range of 1 Gohm, to a conducting (on) state where its resistance is less than 1 Mohm and typically in the range of tens of ohms to thousands of ohms. A conductive filament is formed between two electrodes.

It is well known in the literature that amorphous silicon antifuses can exhibit read-disturb (switching) behavior, namely the undesired changing of the antifuse from its programmed state back to its unprogrammed state. It has been observed that metal-to-metal amorphous silicon antifuses used in field programmable gate arrays exhibits this read-disturb problem. During operation, as current is passed through the programmed antifuse, its on resistance will be "disturbed" such that it will either increase until the resistance is such that the circuit functionality is affected, or will eventually result in an open-circuit condition. The read disturb problems of metal-to-metal antifuses and antifuses employing at least one metal electrode are generally not observed in the diffusion/ONO/polysilicon type antifuse. The present inventors have observed that presently-available data suggests that the metal/dielectric/metal antifuses, as well as metal/amorphous silicon/metal antifuses, exhibit a similar read-disturb problem.

The present inventors have observed that when a DC current of either polarity having a magnitude equal to 50% or more of the original programming current level is applied across the metal-amorphous silicon-metal antifuse, the antifuse will revert to its off state through the destruction of the conductive filament. The present inventors have observed that when a DC current of either polarity having a magnitude equal to 100% or more of the original programming current level is applied across the metal-dielectric-metal antifuse, the antifuse will revert to its off state through the destruction of the conductive filament. While the on resistance of a positively programmed antifuse can be disturbed by a positive DC voltage stress, the disturb probability is much higher for the reverse DC stressed antifuse. In addition, when the operation temperature is raised, the probability of read-disturb increases too. This problem severely limits the operating conditions of the metal-to-metal antifuse and thus restricts design flexibility.

There are several ways to reduce this problem. One programming method which helps to solve this problem comprises increasing the programming current or programming voltage. The result is that the antifuse operating current is at a level which is much less than the programming current. With high programming current or programming voltage, more power is generated during formation of the conductive filament, resulting in a filament having a larger diameter. Such a filament will have higher electromigration resistance and is less likely to be disturbed. In addition, since the operating current will be lower in comparison to the programming current, it adds to the electromigration immunity by providing lower current density through the programmed antifuse, resulting in no phase change or major material transport inside the conductive filament.

However, this approach has built-in penalties. Larger transistors are required to provide the higher programming current or programming voltage. This impacts the die size. In addition, lower operating current to prevent read-disturb reduces the speed of the product. Neither of these alternatives are optimal or desirable.

Another approach to minimizing read-disturb is to reduce the thickness of the antifuse material disposed between the antifuse electrodes. By reducing the thickness of this layer, a larger conductive filament can be created with the same programming voltage. By supplying the same power (I*V) to create a conductive filament, an antifuse with larger thickness will have a relatively smaller conductive filament diameter. During operation, such an antifuse will have higher operation current density and is thus more likely to be disturbed due to electromigration of material from the conductive filament. However, tradeoffs are required when providing a thinner antifuse material layer. Assuming use of the same composition of the antifuse material layer, a thinner antifuse material layer will result in lower breakdown voltage, higher leakage current, and increased capacitance. Its use may thus not be desirable since it impacts functionality and reliability.

One way to overcome this problem is to change the composition of the antifuse material. For example, an amorphous silicon antifuse layer may be replaced with a low-temperature dielectric. Dielectric materials, such as oxide, nitride, or combinations of oxide and nitride have lower leakage current and higher breakdown voltage. Therefore, to maintain the same breakdown voltage requirements, the thickness of the antifuse dielectric has to be reduced. However, reducing the thickness of the antifuse material layer results in an increase in the capacitance of the antifuse in its unprogrammed state. This increased capacitance has a negative impact on the product speed.

Because of the aforementioned drawbacks, the above-recited methods are not optimal solutions to the read disturb problem.

It is an object of the present invention to reduce the read disturb phenomenon observed in antifuses having at least one metal electrode in a manner which does not require either reducing antifuse thickness, or increasing the programming current.

BRIEF DESCRIPTION OF THE INVENTION

The present invention comprises methods for programming antifuses having at least one metal electrode which minimize the read disturb phenomenon. The programming methods of the present invention can also reduce the on resistance of programmed antifuses, especially if the top and bottom electrodes are formed from materials having different resistivities, regardless the polarity of the voltage pulses applied.

According to the present invention, a method for programming such antifuses includes providing a plurality of alternating positive and negative programming voltage pulses across the antifuse to be programmed. Programming antifuses according to the method of the present invention will result in larger and more symmetric antifuse conductive filaments and will render the antifuse more resistant to read-disturb and electromigration.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1A:
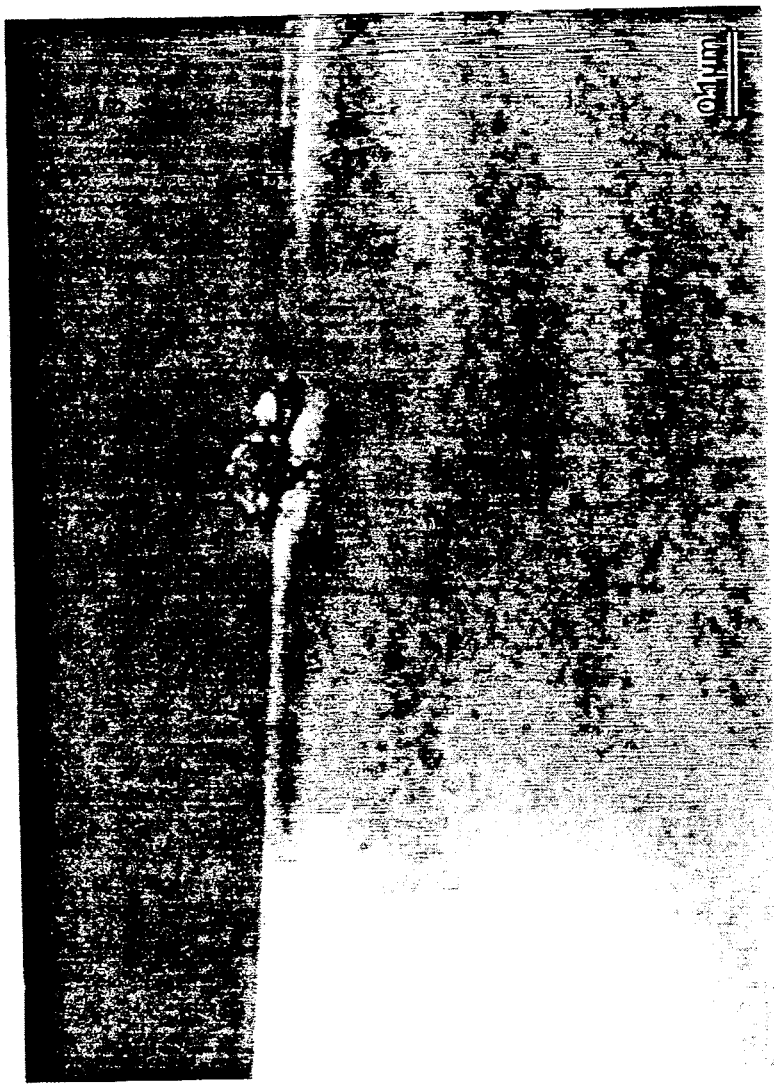
FIG. 1a is a microphotograph of a cross sectional view of an antifuse, taken through the conductive filament formed by applying a positive programming potential to the top electrode of the antifuse and a negative programming potential to the bottom electrode of the antifuse.

According to prior art programming methods, when programming pulses of only one polarity are applied to a metal-to-metal antifuse, e.g. a positive potential is applied to the top antifuse electrode, the structure of the antifuse conductive filament is shown in FIG. 1a. The conductive filament formed in the antifuse is asymmetric. As may be seen from FIG. 1a, the filament has a large-diameter end and a small-diameter end. It has been observed that the large-diameter end of the filament is located closest to the bottom antifuse electrode to which the negative programming potential was applied and the small-diameter end is located closest to the top antifuse electrode to which the positive programming potential was applied. The filament of FIG. 1a is the generally dome-shaped structure disposed in the dark region (the top electrode) having its bottom (large diameter) tangent to the sharp straight horizontal line (defining the antifuse dielectric between the top and bottom electrodes) across the microphotograph.

Figure 1B:
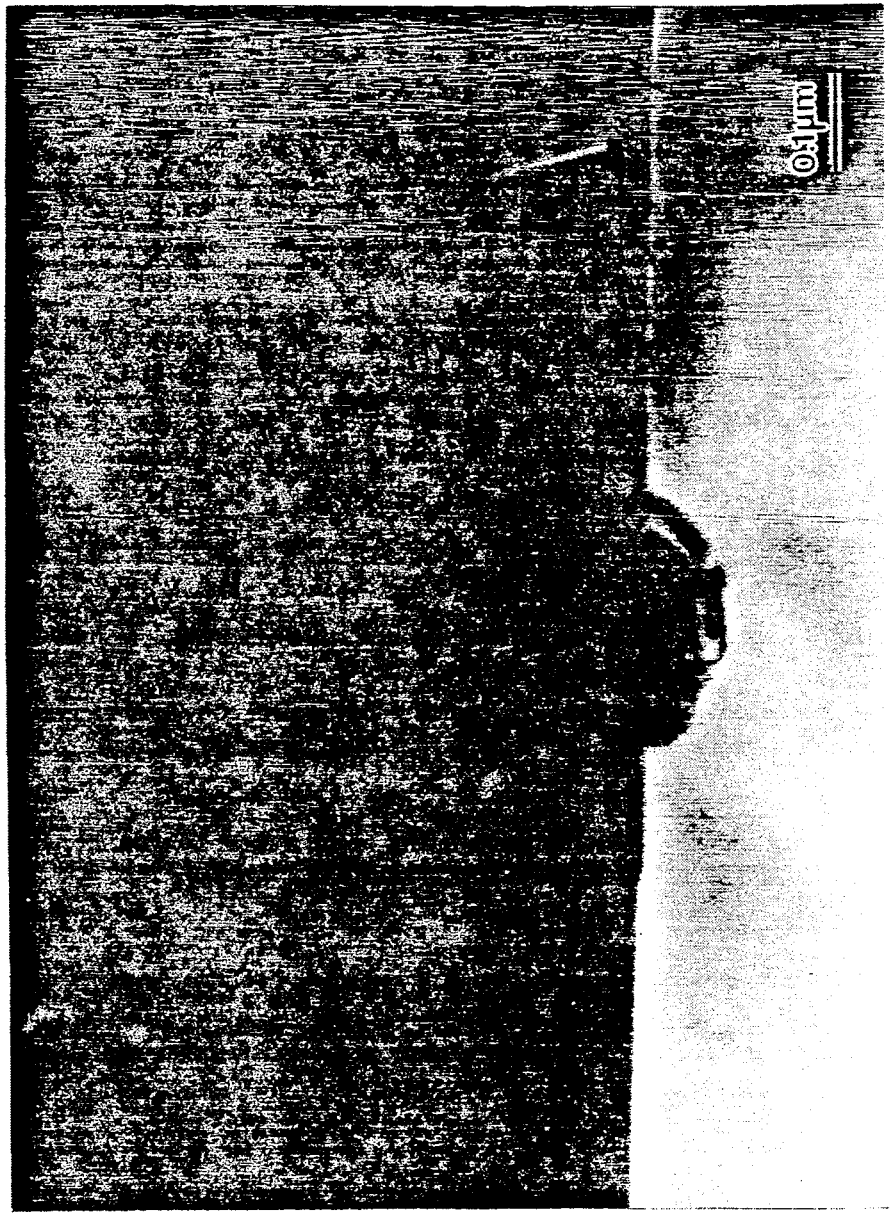
FIG. 1b is a microphotograph of a cross sectional view of an antifuse, taken through the conductive filament formed by applying a negative programming potential to the top electrode of the antifuse and a positive programming potential to the bottom electrode of the antifuse.

If the programming voltage polarity is reversed, i.e., the negative potential is applied to the top antifuse electrode and the positive programming potential is applied to the bottom electrode, the structure of the antifuse conductive filament is shown in FIG. 1b, in which the conductive filament has its large-diameter end located closest to the top antifuse electrode to which the negative programming potential was applied and the small-diameter end is located closest to the bottom antifuse electrode to which the positive programming potential was applied. The filament of FIG. 1b is the inverted generally dome-shaped structure disposed in the light region (the bottom electrode) having its top (large diameter end) tangent to the sharp straight horizontal line (defining the antifuse dielectric between the top and bottom electrodes) across the microphotograph.

As one aspect of the present invention, it has been discovered that the cause of the read-disturb problem in programmed antifuses having at least one metal electrode can be compared to electromigration in metals. This conclusion is supported by several observations. First, it has been discovered that read-disturb occurs only when the electrodes are formed from metal layers, and not when they are formed from polysilicon layers or doped substrate regions. Second, it has been discovered that read-disturb is read-polarity dependent. These factors rule out the thermal model for stress-related cracking, since thermal energy is not polarity dependent. Third, it has been discovered that read disturb in metal-to-metal antifuses is temperature dependent. The higher the temperature, the more read-disturb is observed. All of these factors indicate that read-disturb is an electromigration problem in the on state of the antifuse, since electromigration is also temperature dependent. Once the problem is identified as electromigration, then the shape of the conductive filament will influence the electromigration behavior.

According to the present invention, antifuses having at least one metal electrode may be programmed by applying, for a first time period, a first potential to the upper electrode and a second potential to the lower electrode, the first potential being more positive than the second potential and the difference between the first and second potentials being equal to or greater than the programming potential characteristic of the antifuse to be programmed; applying, for a second time period, the second potential to the upper electrode and the first potential to the lower electrode; and repeating these steps a predetermined number of times. For convention, herein, a positive programming pulse will be defined as a pulse whose most positive potential is applied to the upper antifuse electrode and a negative programming pulse will be defined as a pulse whose most negative potential is applied to the upper antifuse electrode.

The magnitude of the programming potential difference to be applied across the antifuse will depend upon the composition and thickness of the antifuse material layer. Those of ordinary skill in the art will know how to select a particular programming voltage magnitude depending on the particular antifuse to be programmed. Typical values may range from about 5 volts for an antifuse including an antifuse layer of 200 to 500 angstroms of amorphous silicon to about 100 volts for an antifuse including an antifuse layer of 7,000 to 10,000 angstroms of amorphous silicon.

According to a presently preferred embodiment of the invention, the pulse widths for both the positive and negative programming voltage pulses may be anywhere from about 1 μsec to about 10 sec. The number of times the positive and negative programming voltage pulses are applied may be anywhere from 1 to over 1,000 and the pulse widths of the positive and negative pulses need not be the same. Also, the larger the number of times the pulses are applied, the wider and more stable the filament will become. Those of ordinary skill in the art will recognize that an odd number or an even number of pulses may be applied, i.e., that the programming process could both start and end with either a positive or a negative programming pulse.

Figure 2:
FIG. 2 is a microphotograph of a cross sectional view of an antifuse, taken through the conductive filament formed by applying alternating positive and negative programming potential to the top and bottom electrodes of the antifuse.

The conductive filament formed in the antifuse programmed according to the method of the present invention is shown in FIG. 2. By comparing the conductive filament of the antifuse of FIG. 2 with those of FIGS. 1a and 1b, it will be seen that the mass of the conductive filament created in the antifuse of FIG. 2 is disposed in the volumes of both the upper and lower electrodes and has the largest and most symmetrical diameter. This antifuse is far more resistant to deterioration due to read-disturb electromigration than are the filaments depicted in FIGS. 1a and 1b.

The ability to create a symmetric conductive filament shape or even larger conductive filament diameter without increasing the programming current is preferred for reducing read-disturb problem seen in metal to metal antifuses. In addition, the symmetric shape and better conductive filament is more likely created by high frequency AC pulses instead of low frequency AC or even DC pulses since material movement in higher frequency AC pulse is more bi-directional with less polarity dependency. As presently preferred, the frequency with which the pulses are applied is between about 1 KHz to about 1 GHz. Frequencies other than the preferred ranges my also be applied to improve read-disturb.

In a real-world environment, individual antifuses are disposed on a semiconductor wafer or die and are rarely, if ever, directly accessible from outside of the integrated circuit. The antifuses in typical integrated circuits containing them are selected for programming and accessed by a number of known schemes, such as those disclosed, for example, in U.S. Pat. No. 4,823,181, expressly incorporated herein by reference. Generally, these schemes include first providing the integrated circuit with information identifying the antifuse to be programmed. This information is transformed by circuitry in the integrated circuit into signals which provide a programming path to the antifuse to be programmed.

A programming device such as a high-frequency pulse generator is provided which is capable of providing the alternating polarity programming potential. Examples of such high-frequency pulse generators include a Model 8116A pulse generator available from Hewlett Packard Corporation of Palo Alto, Calif. Other examples of such devices include an Activator antifuse programmer available from Actel Corporation of Sunnyvale, Calif. The programmer device is connected to I/O pins of the integrated circuit to complete the programming path to its internal antifuses.

Figure 3:
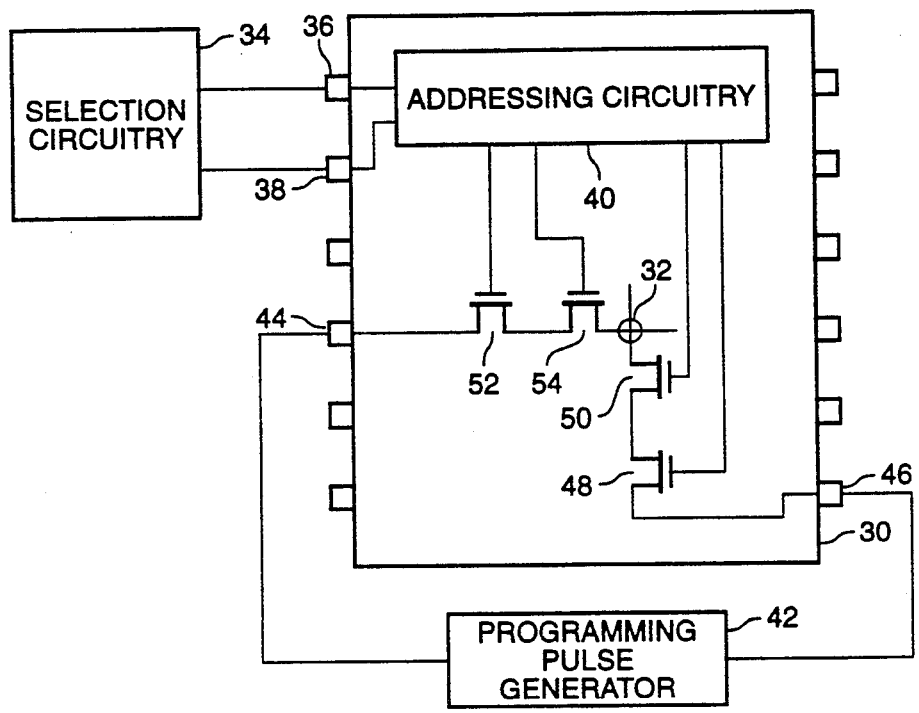
FIG. 3 is a simplified schematic diagram showing the programming of a typical antifuse according to the present invention.

This programming setup is illustrated in simplified schematic diagram form in FIG. 3. Integrated circuit 30 contains illustrative antifuse 32 to be programmed. Selection circuitry 34 is connected via I/O pins 36 and 38 to addressing circuitry 40 located in integrated circuit 30. Manufactures of antifuse array integrated circuits provide selection circuitry 34 to accompany their products. For example, the Activator programmer, available from Actel Corporation of Sunnyvale, Calif., is provided to program Actel antifuse integrated circuit arrays. Details of product use vary by manufacturer, but those of ordinary skill in the art recognize that full information on the use of such devices is provided by the manufacturers.

Pulse generator circuit 42 is connected to the integrated circuit 30 via I/O pins 44 and 46. A programming path from I/O pins 44 and 46 to the antifuse is created by addressing circuitry 40. In FIG. 3, this programming path is illustrated as comprising MOS transistors 48, 50, 52, and 54. The function of addressing circuit 40 is to turn on the gates of MOS transistors 48, 50, 52, and 54 to complete the programming path from the programming pulse generator 42 to antifuse 32.

Those of ordinary skill in the art will recognize that the programming path illustrated in FIG. 3 is oversimplified for the purpose of showing the environment of the present invention without overcomplicating the disclosure. Such skilled persons are familiar with addressing programmable devices and will have no trouble comprehending the invention from the disclosure herein.

Figure 4:
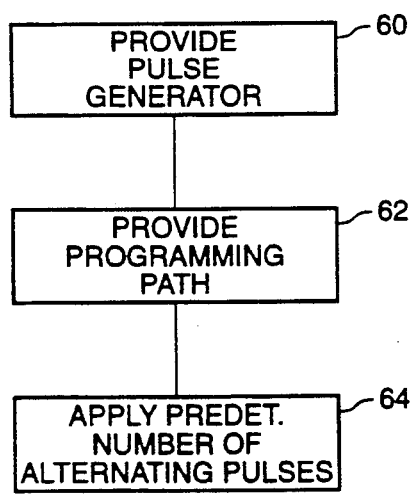
FIG. 4 is a flow diagram illustrating the method of the present invention.

FIG. 4 is a flow diagram illustrating the steps of the present invention. First, at step 60, an antifuse programming voltage source (reference numeral 42 in FIG. 3), capable of supplying alternating positive and negative programming voltage pulses is provided. Next, at step 62 a programming path is provided from the antifuse programming voltage source to the antifuse. This is accomplished in the system of FIG. 3 by downloading the programming information identifying antifuses to be programmed from selection circuitry 34 to the addressing circuitry 40 in integrated circuit 30. Finally, as illustrated at step 64, a selected number of alternating positive and negative programming voltage pulses is provided to the antifuse through the programming path to improve read-disturb.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for programming an antifuse including an antifuse material disposed between a lower electrode and an upper electrode, at least one of said lower and upper electrodes comprising a metal, said antifuse characterized by programming in response to a programming potential, comprising the steps of:
   (1) providing an applied voltage equal to or greater than said programming potential and comprising a first applied voltage potential and a second applied voltage potential, said first applied voltage potential being more positive than said second applied voltage potential;
   (2) applying, for a first time period, said applied voltage between said upper and lower antifuse electrodes, said first and second applied voltage potentials applied to said upper and lower electrodes with a first polarity orientation;
   (3) applying, for a second time period, said applied voltage between said upper and lower antifuse electrodes, said first and second applied voltage potentials applied to said upper and lower electrodes with a second polarity orientation opposite to said first polarity orientation; and
   (4) repeating steps (2) and (3) a number of times to form a read-disturb resistance filament between said upper and lower electrodes, between 1 and 1,000 times to form a read-disturb resistance filament between said upper and lower electrodes.

2. The method of claim 1 where said a number of times is chosen to impart to said antifuse a selected degree of immunity to electromigration.

3. The method of claim 1 wherein said first and second time periods are between about 1 μsec and 10 sec.

4. The method of claim 1 wherein said programming potential is between about 5 volts and 100 volts.

5. A method for programming a metal-to-metal antifuse including an antifuse material disposed between a lower metal electrode and an upper metal electrode, said antifuse characterized by a programming potential, comprising the steps of;
   (1) providing an applied voltage equal to or greater than said programming potential and comprising a first applied voltage potential and a second applied voltage potential, said first applied voltage potential being more positive than said second applied voltage potential;
   (2) applying, for a first time period, said applied voltage between said upper and lower metal antifuse electrodes, said first and second applied voltage potentials applied to said upper and lower electrodes with a first polarity orientation;
   (3) applying, for a second time period, said applied programming voltage between said upper and lower metal antifuse electrodes, said first and second applied voltage potentials applied to said upper and lower electrodes with a second polarity orientation opposite to said first polarity orientation; and
   (4) repeating steps (2) and (3) a number of times between 1 and 1,000 times.

6. The method of claim 5 where said a number of times is chosen to impart to said antifuse a selected degree of immunity to electromigration.

7. The method of claim 5 wherein said first and second time periods are between about 1 μsec and 10 sec.

8. The method of claim 5 wherein said programming potential is between about 5 volts and 100 volts.

* * * * *

UNITED STATES PATENT AND TRADEMARK OFFICE
CERTIFICATE OF CORRECTION

PATENT NO. : 5,316,971
DATED : May 31, 1994
INVENTOR(S) : Steve S. Chiang, Wenn-Jei Chen, Esam Elashmawi It is certified that error appears in the above-indentified patent and that said Letters Patent is hereby corrected as shown below:

Column 1, line 12, repace "is" with --in--.

Colume 8, line 1, delete the text "to form a read-disturb resistance filament brtween said upper and lower electrodes".

Column 8, line 36, after "times" insert --to form a read-disturb resistance filament between said upper and lower electrodes--.

Signed and Sealed this

Second Day of July, 1996

*Attest:*

BRUCE LEHMAN

*Attesting Officer*  Commissioner of Patents and Trademarks